United States Patent
Chudzik et al.

(10) Patent No.: US 6,936,512 B2
(45) Date of Patent: Aug. 30, 2005

(54) SEMICONDUCTOR METHOD AND STRUCTURE FOR SIMULTANEOUSLY FORMING A TRENCH CAPACITOR DIELECTRIC AND TRENCH SIDEWALL DEVICE DIELECTRIC

(75) Inventors: Michael P. Chudzik, Beacon, NY (US); Rajarao Jammy, Wappingers Falls, NY (US); Carl John Radens, LaGrangeville, NY (US); Kenneth T. Settlemyer, Jr., Poughquag, NY (US); Padraic Shafer, Beacon, NY (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/260,085

(22) Filed: Sep. 27, 2002

(65) Prior Publication Data

US 2004/0063277 A1 Apr. 1, 2004

(51) Int. Cl.$^7$ .......................................... H01L 21/8242
(52) U.S. Cl. ..................................... 438/243; 438/386
(58) Field of Search ............................... 438/239, 240, 438/243, 242, 244, 248, 249, 253, 386, 387, 389

(56) References Cited

U.S. PATENT DOCUMENTS

| | | | |
|---|---|---|---|
| 4,649,625 A | * | 3/1987 | Lu .............................. 438/245 |
| 5,360,758 A | | 11/1994 | Bronner et al. |
| 5,384,277 A | | 1/1995 | Hsu et al. |
| 5,545,581 A | | 8/1996 | Armacost et al. |
| 5,606,189 A | | 2/1997 | Adan |
| 5,614,431 A | | 3/1997 | DeBrosse |
| 5,670,805 A | | 9/1997 | Hammerl et al. |
| 5,692,281 A | * | 12/1997 | Rajeevakumar ............ 29/25.42 |
| 5,744,386 A | * | 4/1998 | Kenney ...................... 438/245 |
| 5,844,266 A | | 12/1998 | Stengl et al. |
| 5,874,758 A | | 2/1999 | DeBrosse |
| 5,923,971 A | | 7/1999 | Ho et al. |
| 5,930,585 A | | 7/1999 | Coronel et al. |

(Continued)

Primary Examiner—David Nhu
(74) Attorney, Agent, or Firm—Daryl K. Neff

(57) ABSTRACT

Disclosed herein is a method, in an integrated, of forming a high-K node dielectric of a trench capacitor and a trench sidewall device dielectric at the same time. The method includes forming a trench in a single crystal layer of a semiconductor substrate, and forming an isolation collar along a portion of the trench sidewall, wherein the collar has a top below the top of the trench in the single crystal layer. Then, at the same time, a high-K dielectric is formed along the trench sidewall, the high-K dielectric extending in both an upper portion of the trench including above the isolation collar and in a lower portion of the trench below the isolation collar. The top of the isolation collar is then etched back to expose a portion of the single crystal substrate along the sidewall, and then, a node electrode is formed in conductive contact with the exposed sidewall and also in contact with the high-K dielectric in the lower portion, such that the high-K dielectric remains as a trench sidewall dielectric in the upper portion of the sidewall. In a DRAM memory cell structure, the trench sidewall dielectric may then be used as a gate dielectric of a vertical transistor which accesses the trench storage capacitor in the trench.

20 Claims, 5 Drawing Sheets

U.S. PATENT DOCUMENTS

| | | |
|---|---|---|
| 5,953,607 A | 9/1999 | Hakey et al. |
| 6,110,792 A | 8/2000 | Bronner et al. |
| 6,137,128 A * | 10/2000 | Holmes et al. ............. 257/301 |
| 6,361,598 B1 | 3/2002 | Balachandran et al. |
| 6,383,864 B2 * | 5/2002 | Sheller et al. ............. 438/243 |
| 6,429,148 B1 * | 8/2002 | Chu et al. ................... 438/766 |
| 6,434,041 B2 * | 8/2002 | Forbes ....................... 365/177 |
| 6,441,421 B1 | 8/2002 | Clevenger et al. |
| 6,509,612 B2 | 1/2003 | Clevenger et al. |
| 6,512,266 B1 | 1/2003 | Deshpande et al. |
| 6,518,119 B2 | 2/2003 | Gambino et al. |
| 6,541,331 B2 | 4/2003 | Chudzik et al. |
| 6,541,662 B2 | 4/2003 | Machida et al. |
| 6,544,874 B2 | 4/2003 | Mandelman et al. |
| 6,555,430 B1 | 4/2003 | Chudzik et al. |
| 6,563,160 B2 | 5/2003 | Clevenger et al. |
| 6,565,666 B1 | 5/2003 | Arndt et al. |
| 6,566,190 B2 * | 5/2003 | Lee et al. .................... 438/242 |
| 6,570,256 B2 | 5/2003 | Conti et al. |
| 6,579,759 B1 | 6/2003 | Chudzik et al. |
| 6,583,462 B1 | 6/2003 | Furukawa et al. |
| 6,613,642 B2 | 9/2003 | Rahn et al. |
| 6,620,724 B1 | 9/2003 | Schroeder et al. |
| 6,653,678 B2 | 11/2003 | Chidambarrao et al. |
| 6,664,161 B2 | 12/2003 | Chudzik et al. |
| 6,706,586 B1 | 3/2004 | Collins et al. |
| 6,707,086 B1 | 3/2004 | Jammy et al. |
| 6,709,926 B2 | 3/2004 | Chidambarrao et al. |
| 6,723,611 B2 | 4/2004 | Akatsu et al. |
| 6,724,088 B1 | 4/2004 | Jammy et al. |
| 6,727,540 B2 | 4/2004 | Divakaruni et al. |
| 6,734,097 B2 | 5/2004 | Iggulden et al. |
| 2002/0106857 A1 | 8/2002 | Jammy et al. |
| 2003/0013259 A1 | 1/2003 | Chldambarrao et al. |
| 2003/0017642 A1 | 1/2003 | Conti et al. |
| 2003/0032235 A1 | 2/2003 | Chudzik et al. |
| 2003/0032272 A1 | 2/2003 | Mandelman et al. |
| 2003/0065542 A1 | 4/2003 | Riggs et al. |
| 2003/0068894 A1 | 4/2003 | Igguiden et al. |
| 2003/0082884 A1 | 5/2003 | Faltermeier et al. |
| 2003/0107111 A1 | 6/2003 | Gluschenkov et al. |
| 2003/0114005 A1 | 6/2003 | Rahn et al. |
| 2003/0132509 A1 | 7/2003 | Chudzik et al. |
| 2003/0153198 A1 | 8/2003 | Conti et al. |
| 2003/0201480 A1 | 10/2003 | Chidambarrao et al. |
| 2003/0203587 A1 | 10/2003 | Gluschenkov et al. |
| 2003/0207532 A1 | 11/2003 | Chudzik et al. |
| 2003/0224573 A1 | 12/2003 | Chidambarrao et al. |
| 2004/0012046 A1 | 1/2004 | Chen et al. |
| 2004/0020891 A1 | 2/2004 | Iggulden et al. |
| 2004/0048441 A1 | 3/2004 | Akatsu et al. |
| 2004/0063277 A1 | 4/2004 | Chudzik et al. |
| 2004/0063297 A1 | 4/2004 | Sattlemyer, et al. |
| 2004/0075111 A1 | 4/2004 | Chidambarrao et al. |
| 2004/0084708 A1 | 5/2004 | Seitz et al. |
| 2004/0095896 A1 | 5/2004 | Chudzik et al. |

* cited by examiner

SEMICONDUCTOR METHOD AND STRUCTURE FOR SIMULTANEOUSLY FORMING A TRENCH CAPACITOR DIELECTRIC AND TRENCH SIDEWALL DEVICE DIELECTRIC

FIELD OF THE INVENTION

The invention relates to a semiconductor processing method and structure, and more particularly to a method and structure for forming a node dielectric and trench sidewall device dielectric in an integrated circuit.

BACKGROUND OF THE INVENTION

In a dynamic random access memory (DRAM), a plurality of memory cells are formed in a matrix manner on a substrate. Each memory cell in the DRAM includes at least one transistor and at least one capacitor. For high density, a memory cell typically includes a single capacitor and either one or as few transistors as needed to provide conduction between the capacitor and first level read/write circuits, while conserving chip area. In present DRAMs, the capacitor of the memory cell is constructed according to one of two different, alternative technologies in which it is located either in the lower part of a deep trench, or stacked in a level above the substrate-level transistor. DRAMs having stacked capacitors generally have less planarity than deep trench capacitors. Therefore, where a high degree of planarity is needed, trench capacitor structures are preferred.

In DRAMs as well as in other circuits, it is desirable that a semiconductor chip hold as many circuits and memory cells as possible per unit area. However, while the size of capacitors and devices shrinks from one generation to the next, the operating voltages, logic levels and minimum sensing currents are not reduced at the same rate, such that proportionally greater capacitance is required from the memory cell capacitor in each succeeding generation. One way to increase capacitance is by reducing the thickness of the capacitor dielectric. However, if the capacitor dielectric becomes too thin, an unacceptable number of capacitors in the chip can exhibit excessively high leakage across the dielectric, and therefore render the chip unusable.

Higher capacitance can be achieved without reducing dielectric thickness by using high-K dielectric materials having higher dielectric constants than those conventionally used in DRAMs, of which silicon dioxide is principally used. Amorphous silicon dioxide has a dielectric constant of 3.9. However, forming a high-K dielectric material in a trenched structure poses challenges. High-K dielectric materials have usually been used only in conjunction with stacked capacitor memory cells. But since the trench structure is needed to achieve surface flatness in many circuits, there is a need to incorporate a high-K dielectric node dielectric in a trench capacitor structure. It would further be desirable to form the node dielectric and device gate dielectric of a trench DRAM memory cell at the same time. It would further be desirable to incorporate such trench capacitor node dielectric and device gate dielectric formed at the same time in a DRAM cell having a vertical transistor located above the trench capacitor.

SUMMARY OF THE INVENTION

Accordingly, a method is provided, in an integrated circuit, of forming a high-K node dielectric of a trench capacitor and a trench sidewall dielectric at the same time. The method includes forming a trench in a single crystal layer of a semiconductor substrate, and forming an isolation collar along a portion of the trench sidewall, wherein the collar has a top below the top of the trench in the single crystal layer. Then, a high-K dielectric is formed along the trench sidewall at the same time, the high-K dielectric extending in both an upper portion of the trench including above the isolation collar and in a lower portion of the trench below the isolation collar. The top of the isolation collar is then etched back to expose a portion of the single crystal substrate along the sidewall, and then, a node electrode is formed in conductive contact with the exposed sidewall, and also in contact with the high-K dielectric in the lower portion, such that the high-K dielectric remains as a trench sidewall dielectric in the upper portion of the sidewall. In a DRAM memory cell structure, the trench sidewall dielectric may then be preferably used as a gate dielectric of a vertical transistor which accesses the trench capacitor in the trench.

DETAILED DESCRIPTION OF THE PREFERRED EMBODIMENTS

Figure 1:
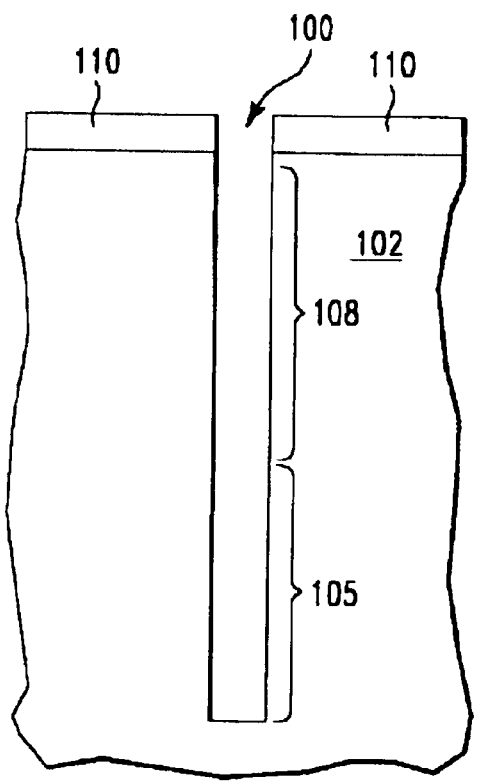
FIGS. 1–10 illustrate stages in a method performed according to a preferred embodiment of the invention.

FIG. 1 illustrates the patterning of a deep trench 100 in a semiconductor substrate 102 having a pad layer (preferably silicon nitride) 110 by a reactive ion beam etch (RIE). The deep trench 100 has a lower portion 105 and an upper portion 108.

Figure 2:
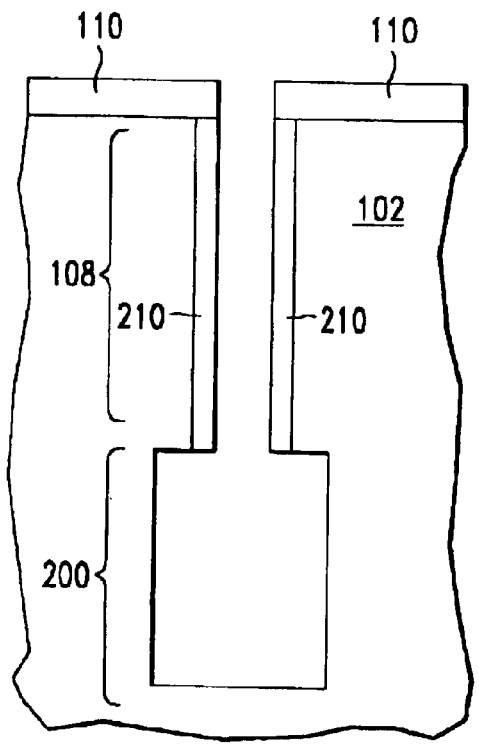

FIG. 2 illustrates how the trench is further enlarged in its lower portion to acquire a bottle-shaped 200. Although the invention can be applied to a trench having straight sidewalls, to further enhance node capacitance, the present invention is preferably used together with any of several techniques for enhancing the surface area of the trench 100, such as a bottle shape (as shown here), lining the inside of the trench with hemispherical silicon grains, the use of wavy trenches, or other techniques, as known to those skilled in the art. Bottle shaped deep trenches, in particular, can be formed according to fabrication processes disclosed in U.S. Pat. No. 4,649,625 to Lu, and U.S. Pat. No. 5,692,281 to Rajeevakumar. In this example, isotropic etching techniques are used to create the desired bottle-shape 200 of the trench 100.

FIG. 2 illustrates a stage in forming a collar in the upper portion 108 of the trench 100 along a sidewall 210 thereof. A thick dielectric is formed in the trench along sidewall 210, preferably by sidewall oxidation, or alternatively, by oxide deposition. The purpose of the collar is to isolate the deep trench 100 from other nearby trenches or other electronic components and devices. The use of an oxide dielectric as the collar is preferred, as one way of permitting a subsequent selective etch of a deposited high-K dielectric material. However, other dielectrics may be used as the collar material, e.g. silicon nitride, so long as there remains a way to expose the semiconductor crystal sidewall of the trench at the top of the collar while leaving the node dielectric and device dielectric layer in place.

Figure 3:
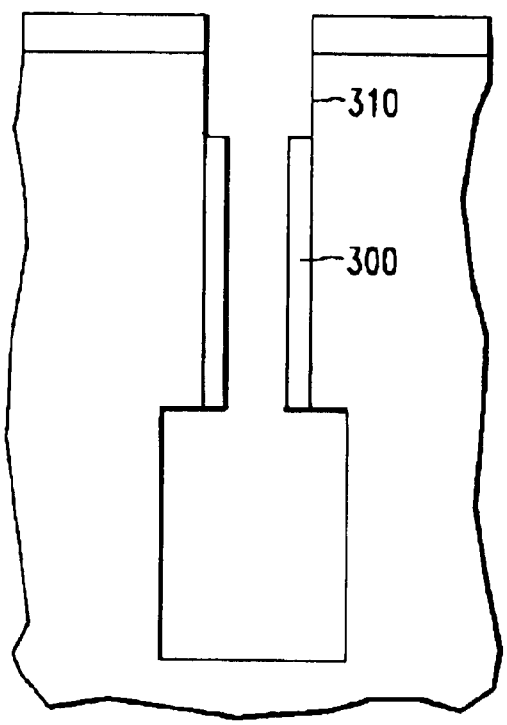
Figure 4:
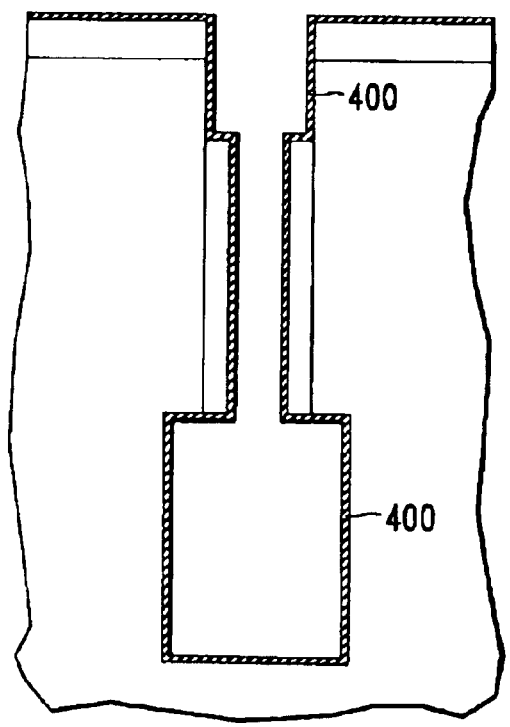

FIG. 3 illustrates the recessing of the oxide sidewalls 210 to form the collar 300. To perform this, after the oxide sidewall is formed, trench 100 is filled with a filler material such as photoresist. The filler material is then recessed and the collar 300 etched to the line of the recess, exposing portion 310 of the semiconductor crystal substrate. FIG. 4 illustrates the trench 100 after depositing a layer 400 of high-K dielectric material. As used herein, "high-K dielectric material" means a dielectric material other than silicon dioxide, and having a dielectric constant greater than that of silicon dioxide, i.e. greater than 3.9. Any high-K dielectric material is suitable that can be selectively left in place during a subsequent etch of the collar 300, as is known to those skilled in the art. The selected high-K dielectric material must also withstand subsequent high-temperature processes including activation and diffusion anneals as are known to those skilled in the art. However, some materials that are preferred include aluminum oxide (Al2O3), zirconium oxide (ZrO2), hafnium oxide (HfO2), barium strontium titanide (BST), barium strontium titanate (BSTO), and silicon oxynitride ($Si_xN_yO_z$).

Figure 5:
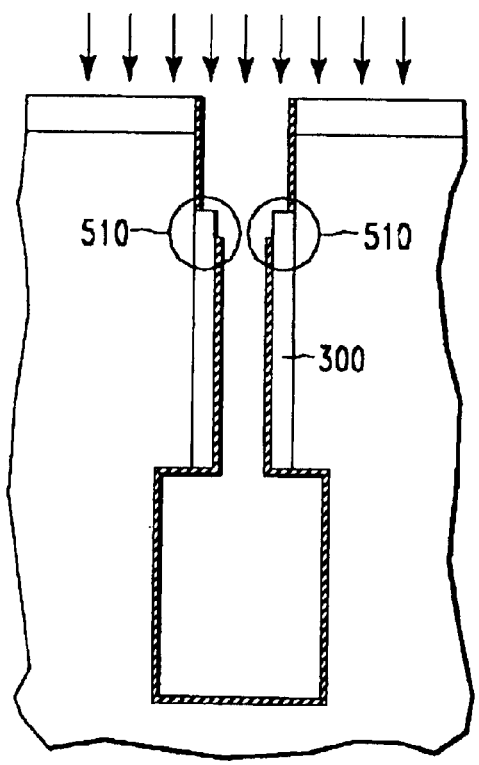

In FIG. 5, trench 100 is directionally etched to expose the top 510 of the collar 300. As an example, an anisotropic dry etch, such as RIE can be used. Directional etching only removes material on surfaces oriented at an angle to the direction of the etch, while leaving material on surfaces which are parallel to the direction of the etch. This etch may be performed after an optional anneal of the high-K dielectric material.

Figure 6:
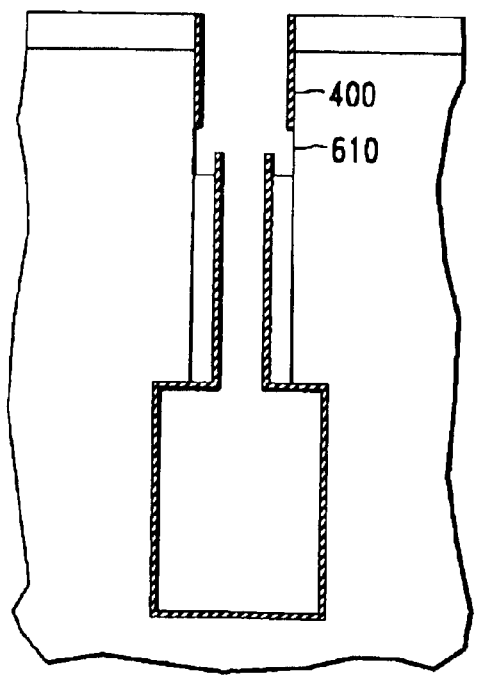

In FIG. 6 a non-directional etch, selective to the high-K dielectric (for example, a selective isotropic wet etch) is performed to etch the exposed collar portion 510, thereby exposing the semiconductor substrate in area 610. When the collar 300 is an oxide, the active chemistry for such etch is preferably hydrofluouric acid (HF); but other chemistries as known to those skilled in the art can also be used. When the collar material is silicon oxide and the optional anneal of the high-K dielectric material is performed prior to this etch, the selectivity of an HF etch to the high-K dielectric material is increased, thereby improving the quality of the remaining high-K dielectric after this etch.

Figure 7:
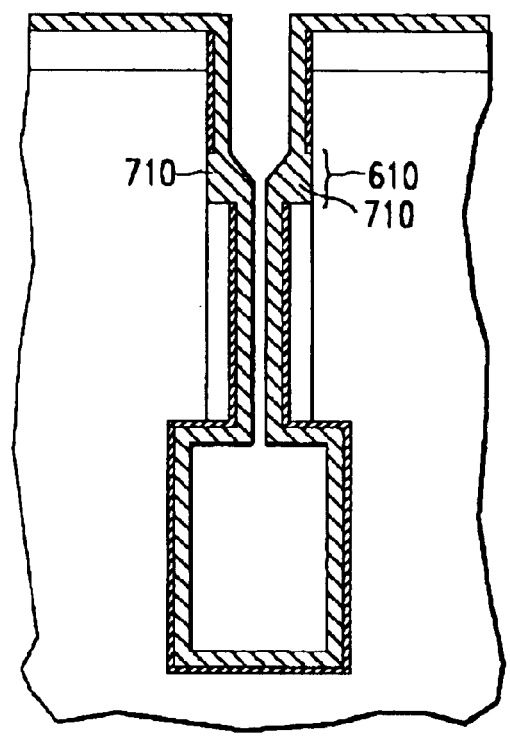

FIG. 7 illustrates the trench 100 after it is filled with a layer of strap conductor material shown as 710. A variety of materials can fulfill this purpose. An example is highly doped polysilicon. Other examples include metals and conductive materials such as metal nitrides, silicides, and conductive oxides. The strap conductor material conductively contacts the sidewall 610 of the semiconductor substrate which was exposed by the above-described collar etch.

Figure 8:
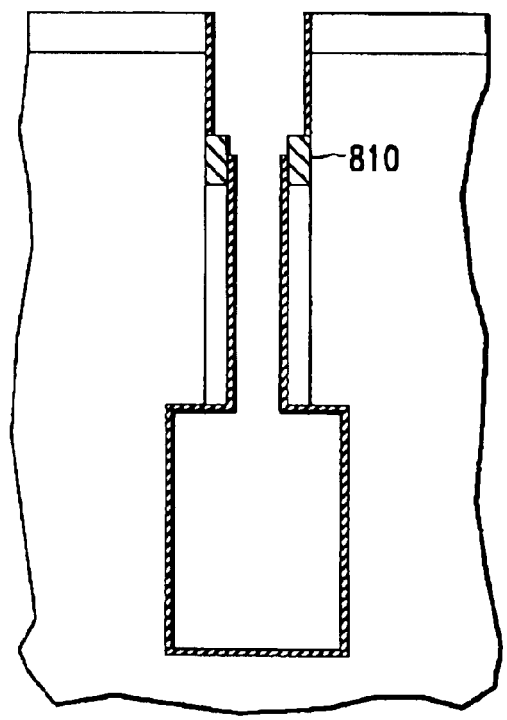

FIG. 8 illustrates the trench (100) of FIG. 7 after the buried strap material (710) is isotropically etched back, leaving it substantially in place in area 810.

Figure 9:
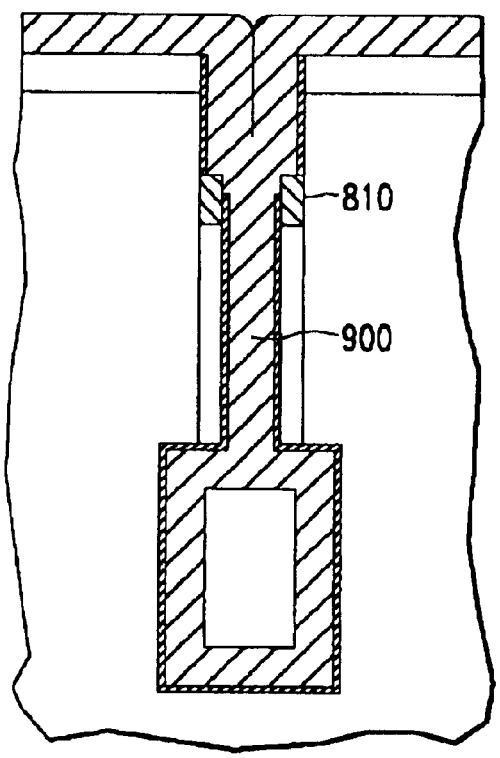

FIG. 9 further illustrates the trench structure (100) after depositing a node electrode material 900. Suitable materials include but are not limited to semiconducting material, conductive silicides, or metals. A preferred material for the node electrode is highly doped polysilicon and/or a metal silicide such as tungsten silicide, so long as the material is compatible with the material selected for the node dielectric 1020 and buried strap material.

As an alternative process to that illustrated in FIGS. 7, 8 and 9, the buried strap material 810 may be deposited together with the node electrode material, thus avoiding the etchback of the buried strap material which is illustrated in FIG. 8. In such case, the node electrode material is deposited following the collar etch (FIG. 6) to line the lower portion of the trench and collar, in a manner similar to that shown in FIG. 8, except that the node electrode fills areas 810 and directly contacts the exposed sidewall 610 of the semiconductor substrate. Thereafter, the node electrode 900 is recessed such that the final height of the electrode 900 is concurrent to the top of the areas 810 used to form dopant sources for the buried strap, within a reasonable tolerance that is prescribed by the device design.

Figure 10:
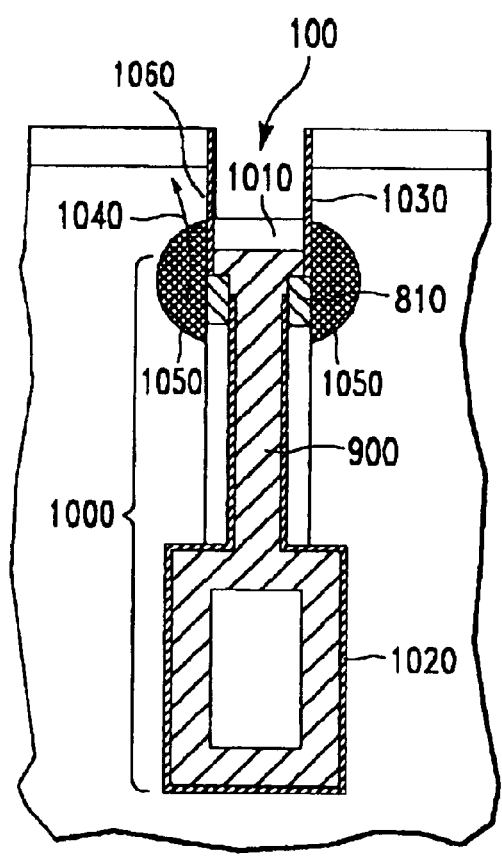

FIG. 10 illustrates the trench capacitor structure 1000 having a node electrode 900 and a trench top isolation oxide (TTO) 1010 formed thereabove, for isolating the trench capacitor 1000 from any devices which may be formed above the TTO 1010. Trench sidewall dielectric 1030 remains above the TTO 1010.

Such trench sidewall dielectric 1030 is now available, for example, as a gate dielectric of a vertical device to be formed in an upper portion of trench 100. For example, in a vertical transistor DRAM, a vertical transistor may be formed having a conduction channel extending vertically within the semiconductor crystal substrate adjacent the trench sidewall dielectric 1030. Alternatively, other devices can be formed using such trench sidewall dielectric. For example, a gated diode can be formed using the trench sidewall dielectric 1030 as a gate dielectric. In another example, without having to remove the trench sidewall dielectric 1030, the particular trench capacitor 1000 can be put to a different use altogether such as a decoupling capacitor having a conduction path 1040 from trench capacitor 1000 to wiring (not shown) above the semiconductor crystal substrate.

At some point of the processing, a further anneal is performed, which drives dopants from the areas 810 adjacent the exposed sidewall into the semiconductor substrate to form a buried strap outdiffusion 1050 extending into the substrate. Such outdiffusion 1050 forms a conductive interconnection between node electrode 900 and channel 1060 of a vertical device of trench 100.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. In an integrated circuit, a method of forming a node dielectric of a trench capacitor and a trench sidewall device dielectric at the same time, comprising:

forming a trench in a single crystal layer of a semiconductor substrate;

forming an isolation collar along a portion of a sidewall of said trench, said isolation collar having a top below a top of said trench in said single crystal layer;

forming, at the same time, a high-K dielectric along said sidewall, extending in both an upper portion of said trench including above said isolation collar and in a lower portion of said trench below said isolation collar;

etching back said top of said isolation collar to expose a portion of said single crystal layer along said sidewall; and forming a node electrode in conductive contact with said exposed single crystal layer and in contact with a node dielectric portion of said high-K dielectric in said lower portion, leaving said high-K dielectric as a trench sidewall device dielectric in said upper portion.

2. The method of claim 1 further comprising enlarging said lower portion of said deep-trench prior to forming said high-K dielectric.

3. The method of claim 2, wherein said lower portion is enlarged by isotropic etching.

4. The method of claim 1, wherein said-hemispherical silicon grains are formed in said lower portion prior to forming said high-K dielectric.

5. The method of claim 1, wherein said isolation collar is formed by sidewall oxidation.

6. The method of claim 1, wherein said isolation collar is formed by depositing a material selected from the group consisting of a nitride and an oxide.

7. The method of claim 1, wherein said high-K dielectric is formed by depositing a high-K dielectric material and, wherein said high-K dielectric material is then directionally etched to expose said top of said isolation collar.

8. The method of claim 1, wherein said high-K dielectric includes a material selected from the group consisting of aluminum oxide (Al2O3), zirconium oxide (ZrO2), hafnium oxide (Hf2), barium strontium titanide (BST), barium strontium titanate (BSTO), silicon oxynitride ($Si_xN_yO_z$).

9. The method of claim 1, said top of said isolation collar is etched back by an isotropic etch.

10. The method of claim 1, further comprising:
   forming a strap conductor adjacent said exposed single crystal layer prior to forming said node electrode.

11. The method of claim 10 wherein said strap conductor is deposited in said trench and etched back to remain essentially only adjacent to said exposed sidewall single crystal layer.

12. The method of claim 1 wherein said node electrode is deposited in physical contact with said exposed-sidewall crystal layer.

13. The method of claim 1 further comprising forming a transistor having as a gate dielectric said trench sidewall device dielectric in said upper portion of said trench.

14. The method of claim 13, wherein a strap conductor is deposited prior to forming said node electrode, said strap conductor deposited and etched back to remain essentially only adjacent to said exposed single crystal layer, said method further comprising recessing said node electrode to a final height concurrent with a top of said etched back strap conductor.

15. The method of claim 14, wherein said method further comprises forming a trench top isolation oxide (TTO) above said node electrode, said TTO isolating said node electrode from said transistor.

16. The method of claim 15, wherein said gate dielectric is disposed above said TTO.

17. The method of claim 1, further comprising forming a gated diode having a gate dielectric said trench sidewall device dielectric in said upper portion of said trench.

18. The method of claim 10, further comprising annealing to drive a dopant from said strap conductor into said exposed single crystal layer to form a buried strap outdiffusion.

19. The method of claim 18, wherein the strap conductor includes highly doped polysilicon.

20. The method of claim 1, wherein said node electrode is formed by depositing a node electrode material to directly contact said exposed single crystal layer and in contact with said node dielectric portion in said lower portion.

* * * * *